United States Patent
Nishimura et al.

(10) Patent No.: US 6,507,029 B1
(45) Date of Patent: Jan. 14, 2003

(54) SAMPLE PROCESSING APPARATUS AND METHOD FOR REMOVING CHARGE ON SAMPLE THROUGH LIGHT IRRADIATION

(75) Inventors: Norimasa Nishimura, Yokohama (JP); Akira Shimase, Yokosuka (JP); Junzou Azuma, Ebina (JP); Asahiro Kuni, Tokyo (JP); Hiroya Koshishiba, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/255,700

(22) Filed: Feb. 23, 1999

(30) Foreign Application Priority Data

Mar. 25, 1998 (JP) .......................................... 10-077719

(51) Int. Cl.⁷ .............................................. H01J 37/30
(52) U.S. Cl. .................................. 250/442.11; 250/398
(58) Field of Search ........................... 250/442.11, 398, 250/492.2, 492.21, 251

(56) References Cited

U.S. PATENT DOCUMENTS

| | | | | |
|---|---|---|---|---|
| 4,705,951 A | * | 11/1987 | Layman et al. | 250/442.11 |
| 4,745,287 A | * | 5/1988 | Truner | 250/442.11 |
| 5,751,537 A | * | 5/1998 | Kumar | 361/234 |
| 6,033,482 A | * | 3/2000 | Parkhe | 118/728 |

FOREIGN PATENT DOCUMENTS

| | | |
|---|---|---|
| JP | A-57-170526 | 10/1982 |
| JP | A-58-106827 | 6/1983 |
| JP | A-59-172232 | 9/1984 |
| JP | A-63-133640 | 6/1988 |
| JP | A-64-59811 | 3/1989 |
| JP | A-1-119668 | 5/1989 |
| JP | A-1-194256 | 8/1989 |
| JP | A-1-243449 | 9/1989 |
| JP | A-2-15552 | 1/1990 |
| JP | A-4-152519 | 5/1992 |
| JP | A-6-120329 | 8/1992 |
| JP | A-7-45693 | 7/1993 |
| JP | A-5-275517 | 10/1993 |
| JP | A-7-134968 | 5/1995 |

OTHER PUBLICATIONS

"Cooperation Development of Electrostatic Floating chuck" by Kyocera Corporation, Nov. 27, 1996.

* cited by examiner

Primary Examiner—Bruce Anderson
(74) Attorney, Agent, or Firm—Antonelli, Terry, Stout & Kraus, LLP

(57) ABSTRACT

In an electron particle machine for observing, inspecting, processing or analyzing a semiconductor wafer as a substrate or a sample, a light source is installed in a preparation chamber. A chucking stage for chucking the semiconductor wafer with a chuck using static electricity is provided with parts for connecting to earth such that they are in contact with the chucked semiconductor wafer. After the chuck using static electricity is released after observation, inspection, process or analysis, a surface of the semiconductor wafer and the parts for connecting to earth are irradiated with light from the light source. This provides conductivity to the surface of the semiconductor wafer, so that charge accumulated on the semiconductor wafer is removed from the surface through the parts for connecting to earth.

9 Claims, 7 Drawing Sheets

SAMPLE PROCESSING APPARATUS AND METHOD FOR REMOVING CHARGE ON SAMPLE THROUGH LIGHT IRRADIATION

BACKGROUND OF THE INVENTION

The present invention relates generally to a method for removing charge accumulated on a substrate or a sample including an insulator and an apparatus for use with the method, and more particularly to a charge removing method for removing accumulated charge from such a substrate or a sample through light irradiation before and after observing, inspecting, processing or analyzing the same, and an apparatus for use with the method.

Currently, a charged particle apparatus, an SPM (Scanning Probe Microscope) apparatus, a dry etching apparatus, a CVD (Chemical Vapor Deposition) apparatus, and so on are used for observing, inspecting, processing and analyzing LSI, photo masks or the like. For chucking a substrate or a sample in such apparatus, a clamping method, a vacuum chuck, a chuck using static electricity, or the like may be used. The clamping method, however, is not capable of completely chucking a substrate and is susceptible to misalignment during observation, inspection, process, analysis or the like, so that this is not a proper chucking method. Also, since most of such observation, inspection, process and analysis are performed in vacuum, the vacuum chuck is not used. Therefore, chucks using static electricity as shown in JP-A-5-275517 and JP-A-6-120329 are generally used as a chucking method for chucking a substrate or a sample during observation, inspection, process, analysis or the like.

However, when a substrate is chucked by a chuck using static electricity, charge accumulates on the substrate to cause a phenomenon that the substrate is not easily removed from a holder. Another phenomenon observed in this event is that the charge accumulated on the substrate attracts particles.

It is therefore necessary to neutralize charge accumulation due to the charge accumulated on the substrate. Conventionally, a variety of method and apparatus have been proposed for neutralizing charge accumulation on a substrate. For example, JP-A-5-275517 brings a conductor connected to the earth into contact with a substrate to neutralize charge accumulation. Also, JP-A-4-152519, JP-A-1-119668, JP-A-1-243449, and JP-A-57-170526 disclose techniques which irradiate an object under processing with light or ultraviolet rays to neutralize charge accumulated on the object under processing. Particularly, JP-A-4-152519 transports a semiconductor substrate to a separate chamber after it has been processed, and irradiates the substrate with ultraviolet rays to neutralize charge accumulation on the substrate in the separate chamber. On the other hand, JP-A-1-119668, JP-A-1-243449, and JP-A-57-170526 irradiate a substrate with light or ultraviolet rays in a chamber for processing the substrate to neutralize charge accumulation on the substrate.

However, since even the neutralization achieved by the foregoing prior art techniques is not sufficient, charge accumulation does remain partially on a substrate, so that the aforementioned problem is still left unsolved. More specifically, when a substrate or a sample is observed, inspected, processed or analyzed using an electron beam, charge accumulates on the surface of the substrate or the sample, so that when the substrate or the sample is extracted after such operation has been terminated, the accumulated charge attracts particles which end up to attach on the surface of the substrate or the sample. This causes contamination or the like on the surface of the substrate or the sample, thereby adversely affecting the processing in the next step. Effective removal of the accumulated charge as mentioned has been very difficult in the prior art.

SUMMARY OF THE INVENTION

It is an object of the present invention to provide a method and apparatus for removing charge through light irradiation so that charge accumulated on a substrate or a sample can be effectively removed in a simple way and with simple means to readily carry the substrate or the sample, and a method and apparatus which use the charge removing techniques.

Difficulties in removing charge accumulated on a substrate or a sample are due to the existence of portions including an insulator within such a substrate or a sample. Therefore, to achieve the above object, the present invention irradiates the substrate or the sample with light at a wavelength which excites electrons in the insulator of the substrate or the sample to produce a photo-conductive effect. Then, a portion of the insulator provided with conductivity through the light irradiation is connected to earth by parts for connecting to earth. In this way, charge accumulated on the insulator is removed from the insulator provided with conductivity through the parts for connecting to earth.

DESCRIPTION OF THE PREFERRED EMBODIMENTS

Figure 1:
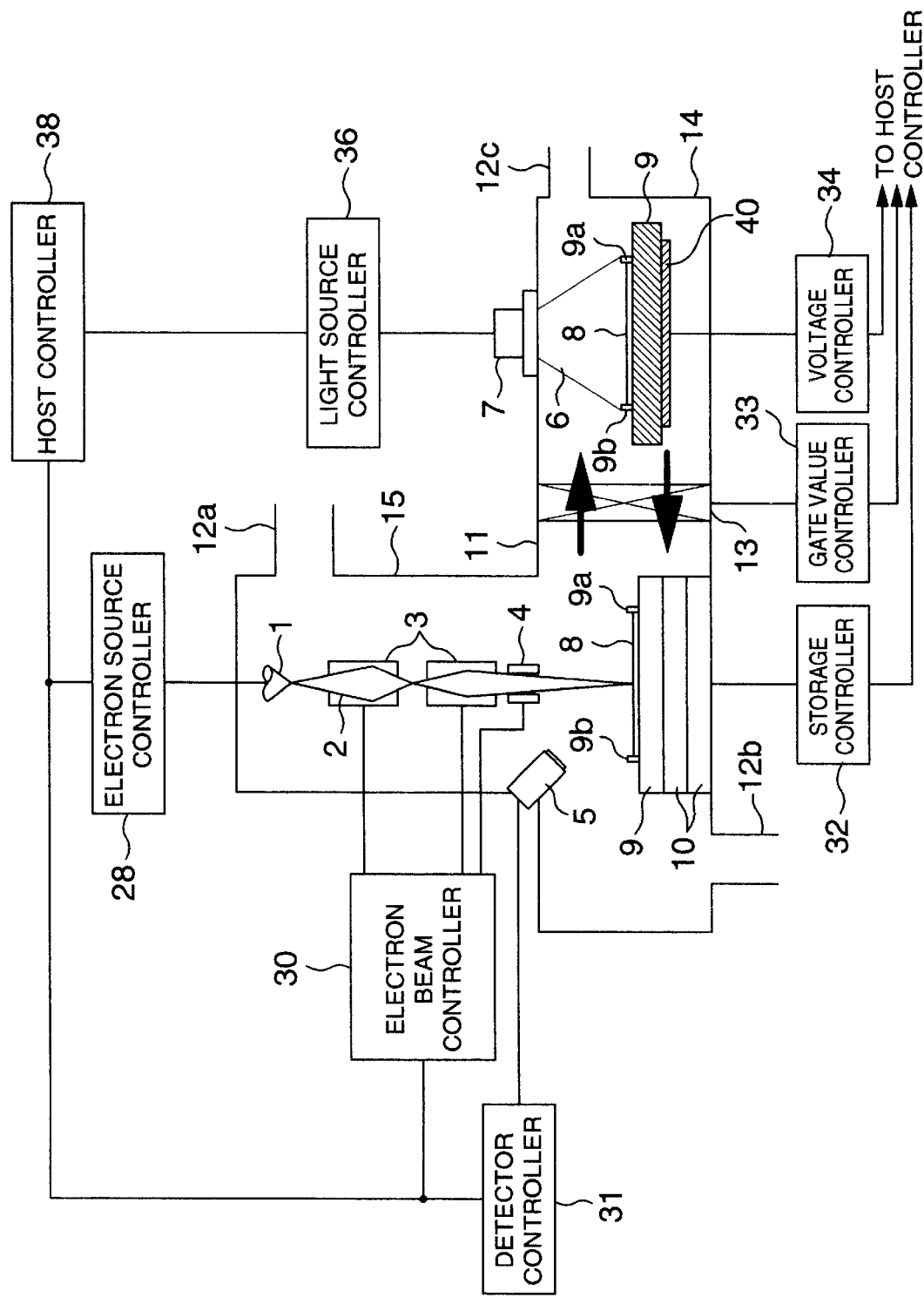
FIG. 1 is a block diagram generally illustrating the configuration of a first embodiment of the present invention.

FIG. 1 illustrates the configuration of a first embodiment of a method for removing charge through light irradiation, a manufacturing method using this method, an apparatus for removing charge through light irradiation, and an apparatus using this apparatus, in accordance with the present invention. The illustrated apparatus includes an electron source 1;

an electron beam 2; a lens 3; a deflection electrode 4; a detector 5; light 6; a light source for excitation 7; a semiconductor wafer 8; a chucking stage 9; parts 9a, 9b for connecting to earth; a stage 10; a process chamber 11; evacuation tubes 12a 12c; a gate valve 13; a preparation chamber 14; and an electron beam chamber 15.

Substrates or samples intended for use with the present invention are those including an insulator, which may be, for example, those having an insulator in an overlying layer or an underlying layer, or those having an insulator on either of the top surface and the bottom surface. The first embodiment will be explained with a specific example of a semiconductor wafer which has an insulator on both the top and bottom surfaces. It will be understood that while the first embodiment illustrates an electron particle machine for performing observation, inspection, process, analysis or the like on a semiconductor wafer, as an apparatus which utilizes the method and apparatus for removing charge, the present invention is of course not limited to the electron particle apparatus but is applicable to a focused ion beam apparatus, an Auger electron spectroscopy, a charged particle wafer/reticle inspection apparatus, a charged beam apparatus such as SIMS (Secondary Ion Mass Spectrometry), a dry etching apparatus, or a CVD apparatus.

In FIG. 1, the electron particle apparatus is composed of an electronic beam chamber 15, a process chamber 11, and a preparation chamber 14. The charge removing apparatus according to the first embodiment is installed in the preparation chamber 14.

The electron beam chamber 15 comprises an electron beam optics which includes an electron source 1 for generating the electron beam 2 under the control of an electron source controller 28; the lens 3 for focusing the electron beam 2; and the deflection electrode 4 for deflecting the electron beam 2. This optics is controlled by an electron beam controller 30. The electron beam chamber 15 is evacuated through the evacuation tube 12a by a vacuum pump, not shown.

The process chamber 11 is a place in which the semiconductor wafer 8 is irradiated with the electron beam 2 generated by the electron beam optics in the electron beam chamber 15 to observe, inspect, process or analyze the semiconductor wafer 8. The chucking stage 9, which has the semiconductor wafer 8 secured by a chuck using static electricity, is mounted on the stage 10. The stage 10 is driven under the control of a stage controller 32 to move the semiconductor wafer 8 to an arbitrary position in the x, y directions within the process chamber 11. Then, the top surface of the semiconductor wafer 8 is irradiated with the electron beam 2, and a secondary particle produced from the surface of the semiconductor wafer 8 is also detected by the detector 5 controlled by a detector controller 31, so that observation, inspection, process or analysis is performed on the surface while viewing the appearance of the surface. The process chamber 11 is evacuated through the evacuation tube 12b by a vacuum pump, not shown.

The preparation chamber 14 is a place in which replacement of the semiconductor wafer 8 or the like is performed. The semiconductor wafer 8 observed, inspected, processed or analyzed in the process chamber 11 is removed from the chucking stage 9, and another semiconductor wafer 8 to be newly observed, inspected, processed or analyzed is mounted on the chucking stage 9. The transport of the chucking stage 9 with the semiconductor wafer 8 mounted thereon from the preparation chamber 14 to the process chamber 11, and the transport in the opposite direction are performed by any transporting means such as a carrier arm or the like, not shown, or by the stage 10 through a gate valve 13 controlled by a gate valve controller 33.

For securing the semiconductor wafer 8 on the chucking stage 9, a chuck using static electricity may be used. More specifically, the chucking stage 9 is a stage capable of electrostatic chucking and made of ceramics or the like. The chucking stage can carry the semiconductor wafer 8 on the top, and is provided with an electrode 40 on the bottom. When the semiconductor wafer 8 is carried on the chucking stage 9, the chucking stage 9 is applied at the electrode 40 with a predetermined voltage by a voltage controller 34. With this applied voltage, charge is produced on the surface of the chucking stage 9, and in response, charge having the opposite polarity to that of the former charge is induced on the bottom surface of the semiconductor wafer 8 (the surface opposite to the chucking stage 9). With an electrostatic force produced by these plus and minus charges, the semiconductor wafer 8 is secured in place on the surface of the chucking stage 9. In the alternative, the electrode 40 may be embedded in the chucking stage 9.

When the chucking stage 9 is transported from the process chamber 11 to the preparation chamber 14 after operations for observation, inspection, process or analysis have been completed, the voltage for the electrostatic chucking, applied to the chucking stage 9, is turned off, and the chucking stage 9 is connected to earth. In this way, the chuck using static electricity should be released. However, the charge on the chucking stage 9 cannot be sufficiently removed, so that the electrostatic chucking action is still partly operative with the remaining charge. This causes difficulties in removing the semiconductor wafer 8 from the chucking stage 9.

Figure 2:
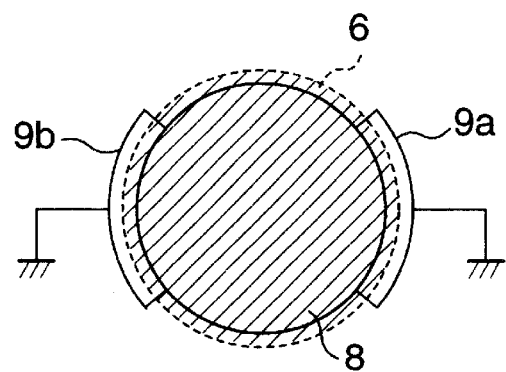
FIG. 2 is an explanatory diagram of a main portion in the embodiment illustrated in FIG. 1.

To eliminate this inconvenience, in the first embodiment, the preparation chamber 14 is provided with the light source for excitation 7. After operations for observation, inspection, process or analysis have been completed, the chucking stage 9 is transported from the process chamber 11 to the preparation chamber 14 by any transporting means such as a carrier arm, not shown. A power source and a controller for driving and controlling the chuck using static electricity stop applying the voltage in response to coordinate data or a detecting signal detected by a position detecting sensor or the like, indicating that the chucking stage 9 has been moved into the preparation chamber 14. After suspending application of a drive voltage to the chuck using static electricity, a power supply and a controller for driving and controlling the light source for excitation 7 drive the light source for excitation 7 in response to coordinate data indicative of the position of the chucking stage 9 or a detecting signal detected by a position detecting sensor or the like, indicating that the chucking stage 9 has been moved into the preparation chamber 14, and irradiates excitation light 6 to the semiconductor wafer 8 on the chucking stage 9. The excitation light 6 is irradiated for a preset time period which may be flexibly varied depending on the material, structure or the like on the surface of the semiconductor wafer 8 by sending appropriate instructions to the controller 36 associated with the light source for excitation 7. For example, when a semiconductor wafer 8 mounted on the chucking stage 9 has a disk-like shape and the conductive parts 9a, 9b have a arc-like shape, the semiconductor wafer 8 is in contact with the arcuate conductive parts 9a, 9b for connecting to earth. In this case, the light 6 is irradiated such that the conductive parts 9a, 9b as well as the entire top surface of the semiconductor wafer 8 (the surface opposite to the chucking stage 9) are exposed thereby. FIG. 2 schematically illustrates an area irradiated with the light 6.

Since the semiconductor wafer 8 also has an insulator on the top surface, the chuck using static electricity mentioned above induces charge similarly on the top surface of the semiconductor wafer 8 due to charge induced on the bottom surface of the semiconductor wafer 8 resulting from a voltage applied to the chucking stage 9. In this state, when the top surface of the semiconductor wafer 8 is irradiated with the light 6, electrons in a valence band are excited to a conductive band on the insulator on the top of the semiconductor wafer 8 irradiated with the light, to provide conductivity to the insulator (photo-conductive effect). In this case, since the conductive parts 9a, 9b are also irradiated with the light 6, the surface of the insulator provided with conductivity is electrically connected to these conductive parts 9a, 9b. Therefore, if the conductive parts 9a, 9b are structured such that they are connected to earth when the chucking stage 9 is moved into the preparation chamber 14, the charge accumulated on the insulator will flow from the now conductive surface to the conductive parts 9a, 9b connected to earth, with the result that no charge remains on the surface of the insulator. However, remaining charge may still exist on the bottom surface of the semiconductor wafer 8, in which case the semiconductor wafer 8 is removed from the chucking stage 9 with difficulties. In this situation, the semiconductor wafer 8 may be removed by means of lift pins while the surface thereof is connected to earth, so that the charge on the semiconductor wafer 8 is removed, as described in JP-A-5-275517. It should be noted that unless the semiconductor wafer 8 is connected to earth after the voltage applied to the chuck using static electricity is stopped, the above-mentioned effect cannot be produced, and worse still, there is a fear that the connection of the semiconductor wafer 8 to earth would lead to breakage of the semiconductor wafer 8 itself.

When the charge is removed from the bottom surface of the semiconductor wafer 8 and on the surface of the chucking stage 9 in the manner mentioned above, the electrostatic chucking is completely released between the chucking stage 9 and the semiconductor wafer 8. As a result, the semiconductor wafer 8 can be readily removed from the chucking stage 9 by letting air in the preparation chamber 14 from the evacuation tube 12c.

It should be noted in FIG. 2 that while the parts 9a, 9b for connecting to earth are both connected to earth independently of each other, these parts 9a, 9b for connecting to earth may be electrically connected to each other, with either of these parts 9a, 9b for connecting to earth being connected to an earth plane at the earth potential.

In considering the wavelength of light emitted by the light source for excitation 7, an irradiated wavelength must have energy above the band gap. The band gap of $SiO_2$ is 9.1 eV which is converted to the wavelength of 136 nm. The band gap of $Si_3N_4$ is 7.5 eV which is converted to the wavelength of 165 nm. However, such calculated values may differ depending upon different measuring methods and/or different measuring conditions. Therefore, assuming that the semiconductor wafer 8 includes an insulator made of $SiO_2$, ultraviolet rays at wavelength of 150 nm or less is desirable as the light 6 emitted by the light source for excitation 7. For $Si_3N_4$, on the other hand, a wavelength of 230 nm or less is desirable.

The removal of the charge through irradiation of the light 6 is instantaneous if the light irradiation is directed simultaneously to the parts 9a, 9b for connecting to earth, as illustrated in FIG. 2. Therefore, the light 6 may be irradiated such that the light source for excitation 7 is always emitting the light 6, or such that the light source for excitation 7 irradiates the light 6 once or twice or more with chopped irradiation when the chucking stage 9 from the process chamber 11 is transported to a position at which the entire top surface of the semiconductor wafer 8 on the chucking stage 9 and the parts 9a, 9b for connecting to earth are simultaneously irradiated with the light 6, as illustrated in FIG. 2.

Since continuous irradiation of a semiconductor substrate with light may cause damages on the substrate, the light source for excitation 7 is controlled to perform chopped radiation, and to permit selection of a pulse width for the irradiated light and selection of the number of times the chopped radiation is repetitively performed, in accordance with a particular material which is irradiated with the light. Such chopped radiation is controlled by the light source controller 36 using conventionally known pulse control techniques. A host controller 38 entirely controls the respective controllers 28–36.

When a chuck using the clamping method or catches is employed as a method of chucking the semiconductor wafer 8, the top surface of the semiconductor wafer 8 is irradiated with the electron beam 2 for observation, inspection, process, analysis or the like within the process chamber 11 to cause charge accumulated on the top surface of the semiconductor wafer 8. This accumulated charge can also be removed in the preparation chamber 14 through similar light irradiation from the light source for excitation 7. If the accumulated charge remained on the top surface of the semiconductor wafer 8, particles would be attracted by the accumulated charge and attach on the top surface of the semiconductor wafer 8. The removal of charge before a process can advantageously reduce the influence of beam drift caused by charge accumulation which may occur when the semiconductor wafer is observed, inspected, processed or analyzed using a charged beam such as an electron beam, an ion beam or the like.

Figure 3:
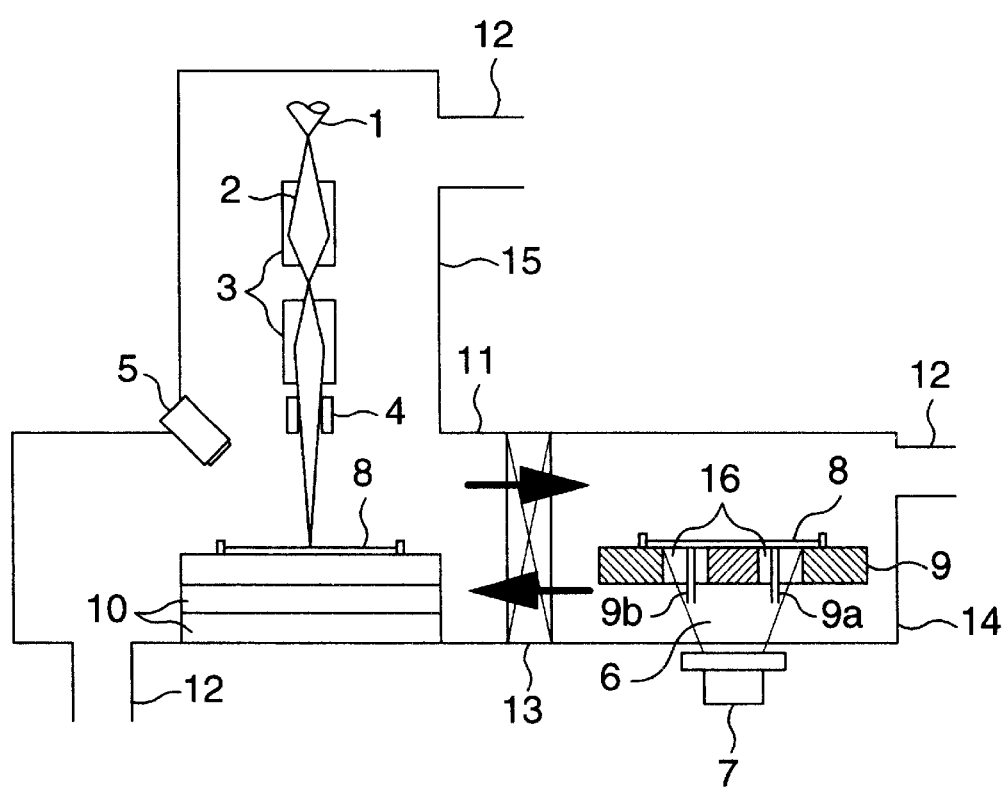
FIG. 3 is an explanatory diagram generally illustrating the configuration of a second embodiment of the present invention.

FIG. 3 illustrates the configuration of a second embodiment of a method for removing charge through light irradiation, a manufacturing method using the same, an apparatus for removing charge through light irradiation, and an apparatus using the same, in accordance with the present invention. The illustrated apparatus includes parts 9a, 9b for connecting to earth, and open areas 16. Parts corresponding to those in FIG. 1 are designated the same reference numerals, and repetitive explanation will be omitted.

The first embodiment illustrated in FIG. 1 irradiates a semiconductor wafer with a light beam from the top surface side, whereas the second embodiment irradiates a semiconductor wafer with light from the bottom surface side. The rest of the second embodiment is similar to the first embodiment.

In FIG. 3, a preparation chamber 14 is provided with a light source for excitation 7 below a chucking stage 9 through which light 6 is irradiated to the bottom surface of a semiconductor wafer 8. The semiconductor wafer 8 is secured on the chucking stage 9 with a chuck using static electricity similar to that in the first embodiment illustrated in FIG. 1.

Figure 4:
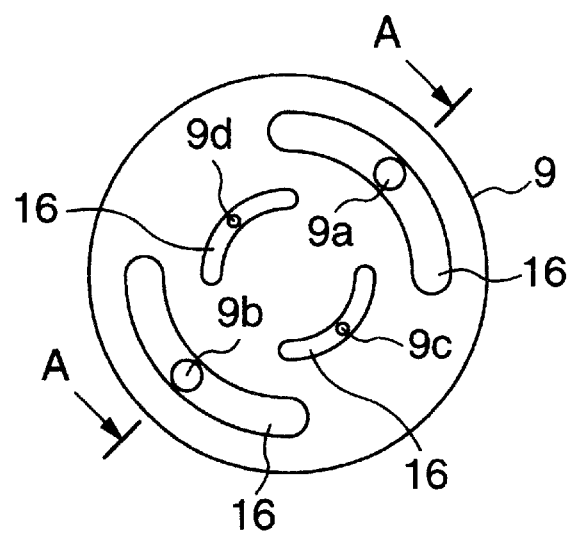
FIG. 4 is an explanatory diagram of a main portion in the embodiment illustrated in FIG. 3.

The chucking stage 9 has a predetermined number of open areas 16, as illustrated in FIG. 3, and parts 9a–9d for connecting to earth are disposed in the corresponding open areas 16, respectively. While these open areas 16 may be hollow, they may be filled with a transparent material which transmits light 6. A portion of the chucking stage 9 in FIG. 3 shows a cross-sectional view taken along a section line A—A in FIG. 4.

In FIG. 3, when the semiconductor wafer 8 on the chucking stage 9 is removed, the bottom surface of the semiconductor wafer 8 comes in contact with the parts 9a–9d for connecting to earth, and the wafer 8 is lifted by the parts 9a–9d for connecting to earth to form a gap between the chucking stage 9 and the wafer 8. The parts 9a–9d for connecting to earth are integrally formed with the chucking stage 9, so that when the semiconductor wafer 8 is removed from the chucking stage 9, the parts 9a–9d for connecting to earth are always in contact with the bottom surface of the semiconductor wafer 8. Also, at least when the light 6 is being irradiated in the preparation chamber 14, the bottom surface of the wafer 8 and the top surface of the chucking stage 9 are irradiated with the light 6 through the gap between the chucking stage 9 and he wafer 8. As a result, the bottom surface of the wafer 8 is connected to the earth potential through an earth line, not shown, in a manner similar to the first embodiment.

With a chuck using static electricity, a voltage applied to the chucking stage 9 will cause charge to indirectly accumulate also on portions of the bottom surface of the semiconductor wafer 8 opposite to the chucking stage 9. When the bottom surface of the semiconductor wafer 8 is irradiated with the light 6 through the open areas 16, charge accumulated on the top and bottom surfaces of the semiconductor wafer 8 and on the surface of the chucking stage 9 can be eliminated through the parts 9a–9d for connecting to earth, thereby making it possible to completely release the chuck using static electricity.

The chucking stage 9 may be entirely made of a dielectric material which transmits the light 6, in which case the whole bottom surface of the semiconductor wafer 8 can be irradiated with the light 6. Similarly, in this case, arcuate parts for connecting to earth may be embedded in such a transparent chucking stage 9 such that they are in contact with the bottom surface of the semiconductor wafer 8, and portions of the bottom surface of the semiconductor wafer 8 in contact with the parts for connecting to earth are also irradiated with the light 6.

As described above, the second embodiment, in addition to producing similar effects to those in the first embodiment illustrated in FIG. 1, is further advantageous in that a space above the chucking stage 9, remaining free, may be utilized to locate an arm or the like for carrying the semiconductor wafer 8, and in that since the light 6 is irradiated to the bottom surface of the semiconductor wafer 8, the critical surface (top surface) of the semiconductor wafer 8 is free from damages due to light irradiation.

A light transparent material filled in the open areas 16 illustrated in FIG. 3 is preferably $MgF_2$, LiF or the like when the irradiated light 6 has the wavelength of 150 nm or less.

Figure 5:
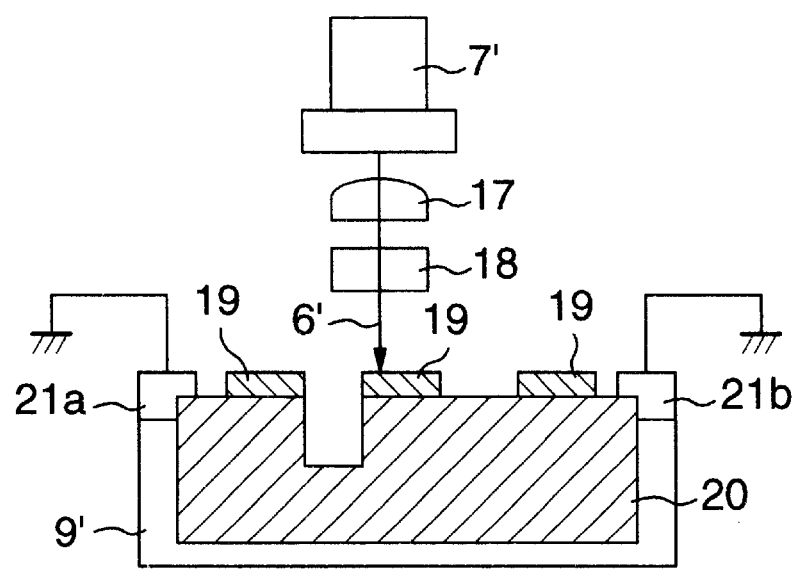
FIG. 5 is an explanatory diagram illustrating a main portion in a third embodiment of the present invention.

FIG. 5 illustrates a third embodiment of a method for removing charge through light irradiation, a manufacturing method using the same, an apparatus for removing charge through light irradiation, and an apparatus using the same, in accordance with the present invention. More specifically, FIG. 5 illustrates the configuration of a main portion in a preparation chamber which includes a light beam 6'; a beam portion 6a; a light source for excitation 7'; a chucking stage 9'; a convexo-plane cylindrical lens 17; a plano-concave cylindrical lens 18; a conductive thin film pattern 19; an insulating substrate 20; and parts 21a, 21b for connecting to earth.

The third embodiment is intended to remove charge from a phase shift mask. While FIG. 5 illustrates a charge removing apparatus, the general configuration of the apparatus is similar to that illustrated in FIG. 1.

Figure 6:
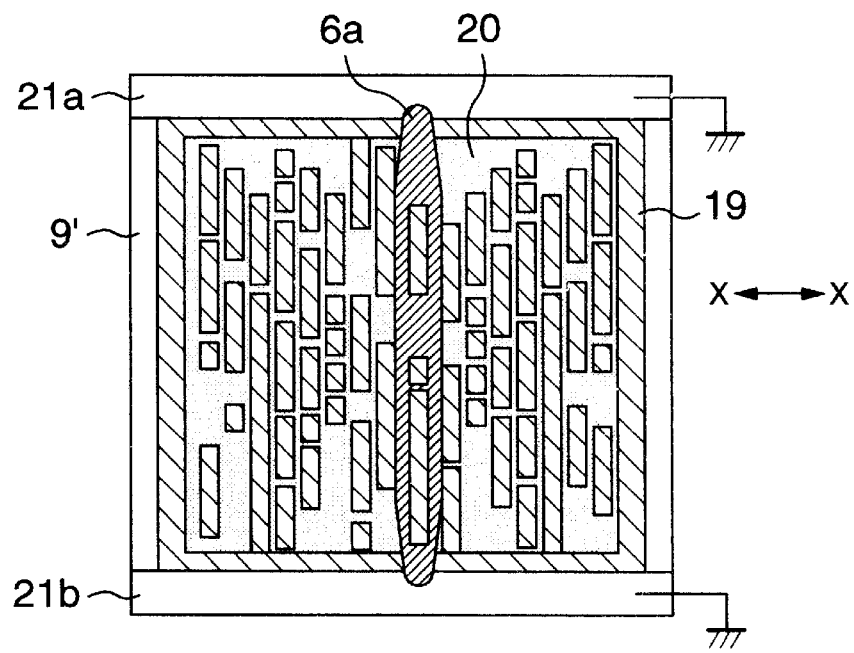
FIG. 6 is an explanatory diagram viewed from the above of FIG. 5.

In FIGS. 5 and 6, a phase shift mask comprises the conductive thin film pattern 19 formed on a surface of the insulating substrate 20. A charged particle apparatus is used for observing, inspecting, processing or analyzing the phase shift mask. For chucking the insulating substrate 20 on the chucking stage 9', a clamping method is generally used. When such observation, inspection, process or analysis is performed, a charged beam is irradiated, causing charge accumulation to occur on the surface of the phase shift mask supported by the insulating substrate 20, with the result that charge is accumulated on the phase shift mask.

To remove the accumulated charge, in the third embodiment, at least two opposing sides of the phase shift mask are in contact with the parts 21a, 21b for connecting to earth which are electrically connected to each other. In addition, the light beam 6' from the light source for excitation 7' is reshaped by the convexo-plane cylindrical lens 17 and a plano-concave cylindrical lens 18 into the beam portion 6a having an elongated cross-section which extends between the parts 21a, 21b for connecting to earth, as illustrated in FIG. 6, and this beam portion 6a is irradiated to the surface of the phase shift mask. Further, the chucking stage 9' is moved in a direction indicated by an arrow X such that the light beam 6' scans in the direction parallel to the parts 21a, 21b for connecting to earth indicated by the arrow X.

In a portion of the surface of the phase shift mask irradiated with the light beam 6', electrons in the valence band are excited to the conduction band due to the photoconductive effect to provide the portion with conductivity, as is the case of the semiconductor wafer 8 in the foregoing first and second embodiments, so that a charge accumulated on that portion escapes to an earth plane, not shown, through the parts 21a, 21b for connecting to earth, in a manner similar to the foregoing embodiments. Therefore, by the light beam 6a scanning the surface of the phase shift mask, the charge accumulated on the entire surface can be removed.

Assuming now that the charged particle apparatus, to which the third embodiment is applied, is constructed similarly to the apparatus illustrated in FIG. 1, the chucking stage 9' mounted with the phase shift mask is moved from a process chamber 11 to the preparation chamber 14, and the light source for excitation 7' radiates the light beam 6' such that the light beam 6' scans the surface of the phase shift mask in the preparation chamber 14 as the chucking stage 9' is moved. Of course, a scanning means may be provided for the light beam 6' such that the surface of the phase shift mask is scanned by the light beam 6' while the chucking stage 9' is stopped.

While an elongated beam is used as the light beam 6', the light beam 6' is not limited to this particular shape, but any beam shape may be used instead as long as it extends over the parts 21a, 21b for connecting to earth. Therefore, the used lenses are not either limited to the convexo-plane cylindrical lens 17 and the plano-concave cylindrical lens 18.

Figure 7:
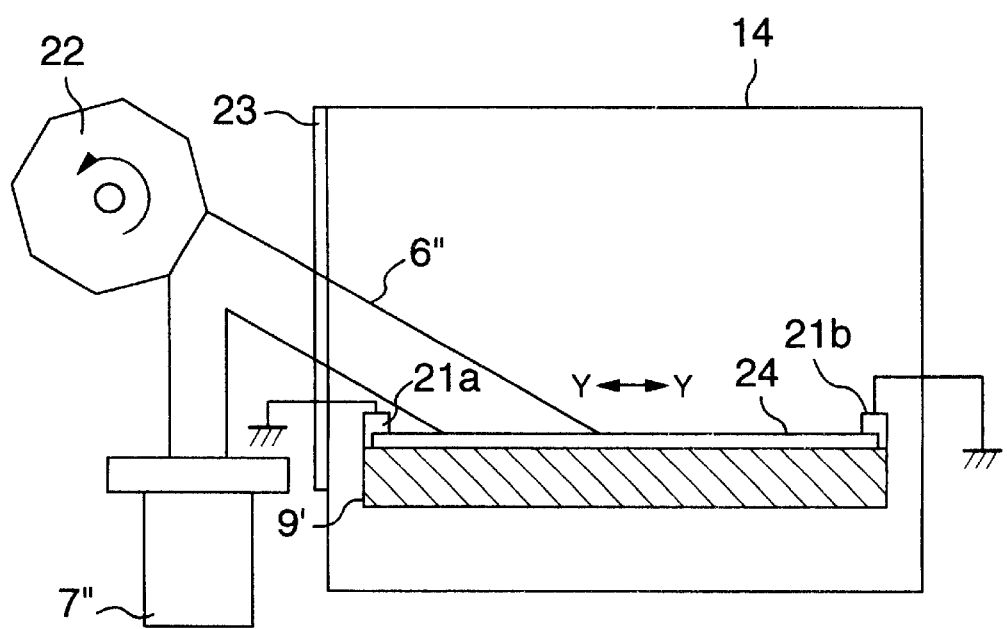
FIG. 7 is an explanatory diagram illustrating a main portion in a fourth embodiment of the present invention.

FIG. 7 is a schematic diagram illustrating a main portion in a fourth embodiment of a method for removing charge through light irradiation, a manufacturing method using the same, an apparatus for removing charge through light irradiation, and an apparatus using the same, in accordance with the present invention. The apparatus includes a light beam 6"; a light source for excitation 7"; a polygon mirror 22; a transparent wall 23; and a phase shift mask 24. Parts corresponding to those in FIGS. 1 and 5 are designated the same reference numerals.

While the fourth embodiment is also intended to remove charge from a phase shift mask, it is also applicable to removal of charge from a semiconductor wafer. Also, while FIG. 7 illustrates a charge removing apparatus in a preparation chamber, the general configuration of the apparatus is similar to that illustrated in FIG. 1.

In FIG. 7, a chucking stage 9' on which the phase shift mask 24 is secured is moved in the preparation chamber 14 in a direction perpendicular to the plane of the drawing (hereinafter, called the "X-direction"), and the light beam 6" repetitively scans the surface (top surface) of the phase shift mask 24 in a Y-direction perpendicular to the moving direction of the chucking stage 9', indicated by an arrow, from one part 21b for connecting to earth to the other part 21a for connecting to earth.

Since the wall 23 on one side of the preparation chamber 14 is transparent, the light beam 6" generated from the light source for excitation 7" provided external to the preparation chamber 14 is reflected off the polygon mirror 22, passes through the transparent wall 23 of the preparation chamber 14, and is irradiated to the phase shift mask 24 on the chucking stage 9'. Here, the polygon mirror 22 is rotated about an axis parallel to the X-direction, thereby allowing the light beam 6" to scan the phase shift mask 24 as mentioned above.

With the configuration described above, in a portion of the surface of the phase shift mask 24 irradiated with the light beam 6", electrons in the valence band are excited to the conduction band due to the photo-conductive effect to provide the portion with conductivity, as mentioned above, allowing charge accumulated on that portion to freely move. Then, the conductive portion passes as the light beam 6" is scanning, and the charge also moves together with the conductive portion. When a portion irradiated with the light beam 6" reaches the part 21b for connecting to earth, the moving charge so far attracted by the conductive portion, passing together with the light beam 6", flows into the part 21b for connecting to earth. Of course, in this event, the part 21b for connecting to earth is connected to the earth potential through an earth line, not shown, in a manner similar to the respective embodiments described above.

In this way, each time the light beam 6" scans the surface of the phase shift mask 24, the charge accumulated on the scanned area escapes to the part 21b for connecting to earth, so that when the light beam 6" has scanned the entire surface of the phase shift mask 24, the charge accumulated on the entire surface has been removed. It is therefore possible to produce similar effects to those of the embodiment illustrated in FIG. 5 without requiring the cylindrical lenses 17, 18 shown in the embodiment illustrated in FIG. 5.

In the configuration illustrated in FIG. 7, since the light beam 6" is scanning the surface of the phase shift mask 24 obliquely from the part 21a for connecting earth, the part 21a for connecting earth does not serve for any action. However, for example, the ceiling of the preparation chamber 14 may be made transparent such that the light beam 6" is reflected off a single swinging mirror to repetitively scan the surface of the phase shift mask 24 in reciprocation through the ceiling. In this case, the part 21a for connecting to earth also functions.

In the respective embodiments described above, a substrate or a sample such as the semiconductor wafer 8 or the phase shift mask 24 are carried from a preceding process device to the chucking stage in the preparation chamber 14 by a carrier arm before it is observed, inspected, processed or analyzed and mounted thereon. When the carrier arm is used to carry a substrate or a sample, if the carrier arm chucks the substrate or the sample with a chuck using static electricity, charge may be accumulated on the substrate or the sample, thereby preventing the substrate or the sample from being removed from the carrier arm.

To solve this problem, a carrier arm is provided with a part for connecting to earth, as a fifth embodiment of a method for removing charge through light irradiation and an apparatus for use with the method, such that a chuck using static electricity is released when a substrate or a sample is transported from the carrier arm to a chucking stage, light is simultaneously irradiated to the surface of the charged substrate or sample and the part for connecting to earth of the carrier arm to allow the charge accumulated on the substrate or the sample to escape from the part for connecting to earth. The fifth embodiment will be explained in detail with reference to FIG. 8.

Figure 8:
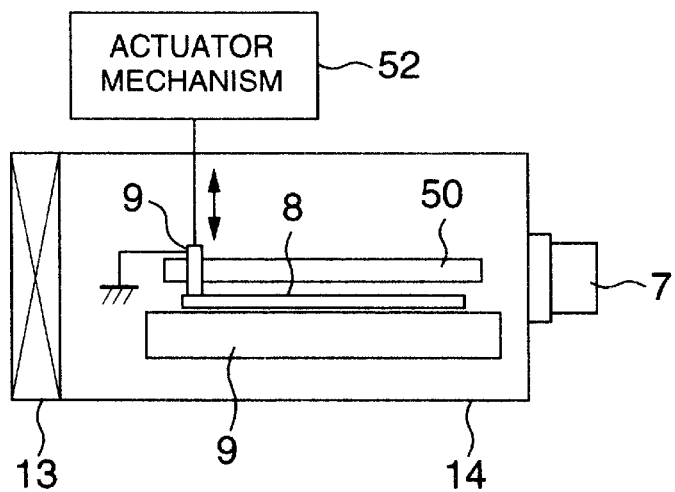
FIG. 8 is an explanatory diagram illustrating a main portion in a fifth embodiment of the present invention.

FIG. 8 illustrates an example which utilizes an electrostatically floating type non-contact carrier arm described in "Cooperation Development of Electrostatic Floating Chuck" published by Kyocera Corporation on Nov. 27, 1996. In FIG. 8, a carrier arm 50 forms a planar chuck using static electricity which is transported between a preparation chamber 14 and the preceding process by a conventionally known mechanism, not shown.

A semiconductor wafer 8, which is floated in space by the electrostatic chuck type carrier arm 50, is chucked and carried in a non-contact state by the electrostatic chuck type carrier arm 50.

When the carrier arm 50 reaches above the chucking stage 9, a voltage applied to the chuck using static electricity is turned off. Subsequently, an earth electrode 9 associated with the chuck using static electricity is brought into contact with the surface of the semiconductor wafer 8 by a motor or an actuator mechanism such as an air piston. Then, excitation light from a light source for excitation 7 is irradiated in a lateral direction to a space between the semiconductor wafer 8 and the electrostatic chuck type carrier arm 50 to remove charge accumulated on the surface of the semiconductor wafer 8.

In this way, the charge accumulated on the substrate or the sample by the chuck using static electricity on the carrier arm is removed, so that the substrate or the sample is readily passed to the chucking stage.

Further, the above embodiment is an example in which the electrostatically floating type carrier arm is moved between the preparation chamber and the preceding process portion, but the present invention is not limited to this embodiment. For example, the carrier arm may be moved between the preparation chamber 14 and the process chamber 11.

In the respective embodiments described above, a substrate or a sample is irradiated with the light 6 or the light beam 6' or 6" from one direction. In a sixth embodiment of a method for removing charge through light irradiation and an apparatus for use with the method according to the present invention, the same substrate or sample is irradiated with light from two or more directions before or after observation, inspection, process or analysis. In this event, while separate light sources may be used for radiating light for irradiating to the substrate or the sample from the respective directions, optical parts such as a half mirror, an optical fiber or the like may be used to split light from the same light source. For example, an optical fiber may be used to irradiate light simultaneously to the top surface and the bottom surface of a substrate or a sample, thereby making it possible to more effectively remove charge accumulated on such a substrate or a sample.

Figure 9:
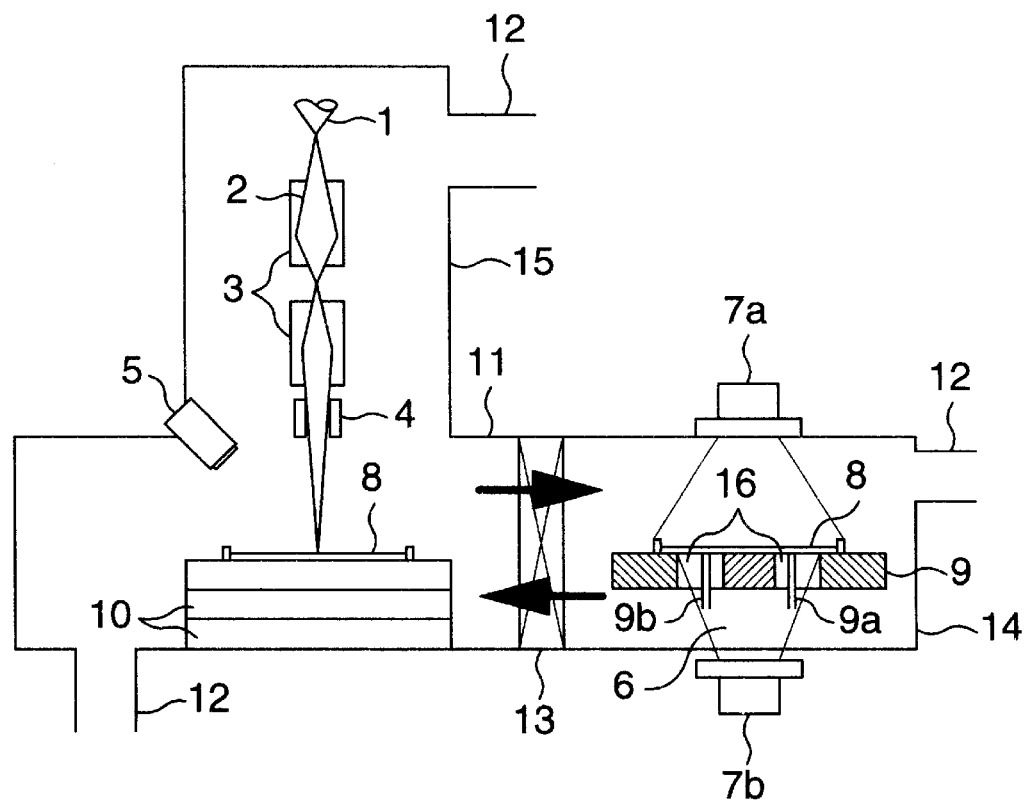
FIG. 9 is an explanatory diagram generally illustrating a sixth embodiment of the present invention.

FIG. 9 illustrates an example of the sixth embodiment which comprises light sources for excitation 7a, 7b independently above and below a chucking stage 9.

Further, charge may be accumulated on a substrate or a sample when it is being carried by a carrier arm before or after observation, inspection, process or analysis, so that particles are attracted by the accumulated charge and attach on the surface of the substrate or the sample. A seventh embodiment of a method for removing charge through light irradiation and an apparatus for use with the method according to the present invention is intended to solve this problem. Specifically, the seventh embodiment includes means for irradiating light to the surface of such a substrate or a sample that is being carried, and means for connecting the surface to earth. Through light irradiation using these means, charge accumulated on the surface of the substrate or the sample is removed through the earth connection means, thereby preventing particles from attaching on the surface. In this case, a method for chucking a substrate or a sample on the carrier arm is limited to a clamping method, catches or the like.

While in the foregoing explanation of the embodiments, $SiO_2$ has been given as an example of an insulator included in a substrate or a sample, a natural oxide film such as SiO, for example, may also be utilized.

Figure 10:
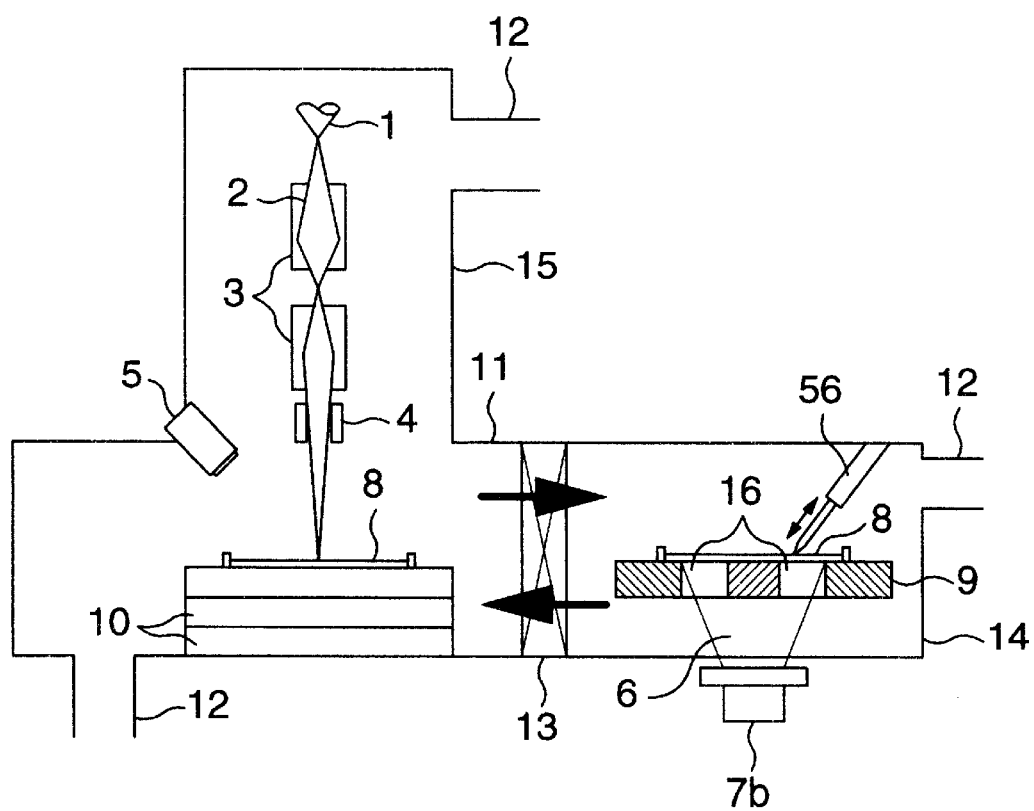
FIG. 10 is an explanatory diagram showing an example of a modification to the embodiment illustrated in FIG. 3.

As the parts for connecting to earth in the embodiments illustrated in FIGS. 1, 3 and so on, a probe type or a spring plate type telescopical part 56 as illustrated in FIG. 10 may be used such that the part 56 for connecting to earth is brought into contact with a substrate or a sample when it is irradiated with light.

Also, the foregoing embodiments have been intended to remove charge from a substrate or a sample which is provided with a conductive pattern on the surface of an insulator, such as a semiconductor wafer or a phase shift mask. A similar removal of accumulated charge can be accomplished even with a substrate formed only of an insulator such as that before a conductive pattern is formed thereon.

Next, a further embodiment of the present invention will be explained with reference to FIGS. 11 to 13. Since the general configuration is similar to that illustrated in FIG. 1, the following explanation will be given only of parts different from those illustrated in FIG. 1.

Figure 11:
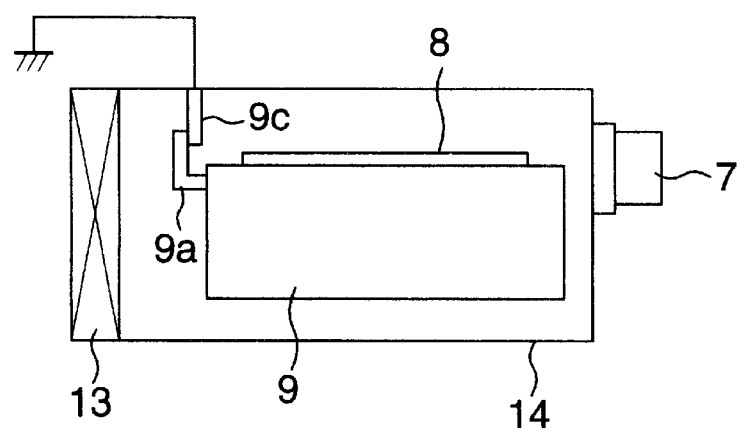
FIG. 11 is an explanatory diagram illustrating a further embodiment of the present invention.

A chucking stage 9 forms a chuck using static electricity such that a semiconductor wafer 8 is carried on the top surface thereof, as illustrated in FIG. 11. FIG. 12 is a plan view of the chucking stage 9 viewed from above FIG. 11. As illustrated in FIG. 12, the chucking stage 9 is formed in the top surface with three grooves 60. Three horizontal extensions of a part 9a for connecting to earth are fitted into left end portions of the respective grooves. The part 9a for connecting to earth has an upright portion integral to the horizontal extensions to form an L shape as a whole.

When the chucking stage 9 reaches a predetermined position in a preparation chamber 14, the part 9a for connecting to earth abuts to an earth electrode 9c connected to earth.

Figure 12:
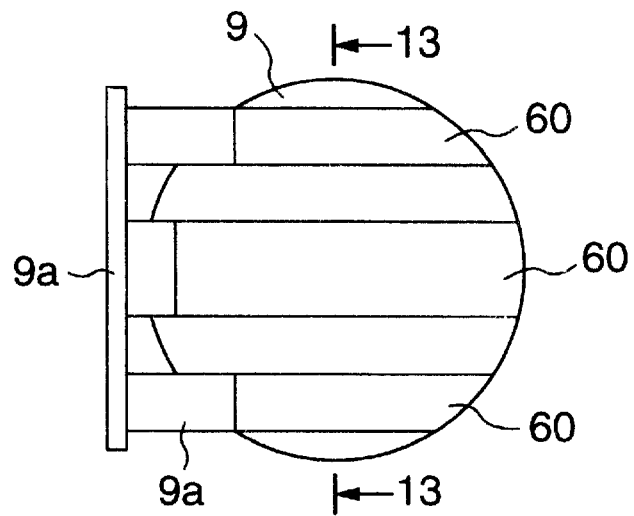
FIG. 12 is a plan view of a main portion in FIG. 11.
Figure 13:
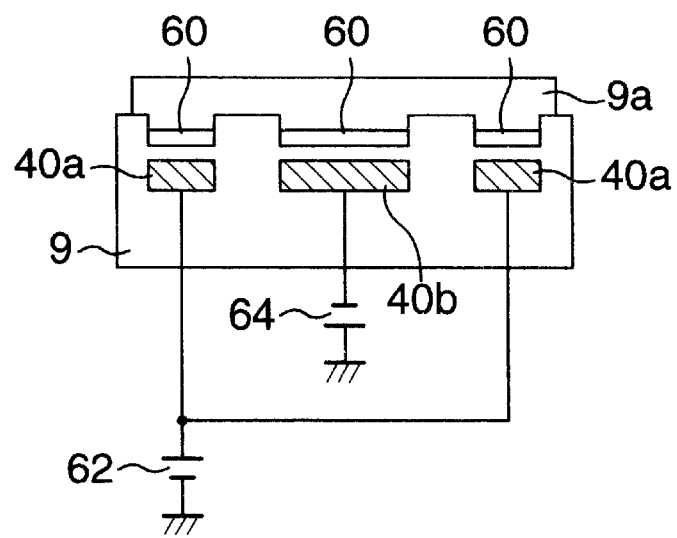
FIG. 13 is a cross-sectional view taken along a line 13—13 in FIG. 12.

FIG. 13 shows a cross-sectional view taken along a line 13—13 in FIG. 12. As illustrated in FIG. 13, electrodes 40a, 40b for applying voltages for a chuck using static electricity are embedded at positions opposite to the respective grooves 60. These electrodes 40a, 40b can be applied with direct currents from power sources 62, 64 in such a manner that they can be turned off if required.

The light source for excitation 7 is installed in a right-hand portion of the preparation chamber 14, so that light from the light source 7 is irradiated to groove walls opposite to the bottom surface of the semiconductor wafer 8 and the electrodes 40a, 40b through the grooves 60 of the chucking stage 9.

During transport from a process chamber to the preparation chamber, or at a position in the preparation chamber not contacted to the earth electrode, the voltages applied to the electrodes 40a, 40b for the chuck using static electricity are turned off. Afterward, at a position where the part 9a for connecting to earth gets in contact with the earth electrode 9c, excitation light is irradiated from the light source for excitation 7 in a lateral direction of the chucking stage. The excitation light is irradiated into spaces between the semiconductor wafer and the grooves 60 formed in the chucking stage to remove charge remaining on a dielectric material. When the bottom surface of the semiconductor wafer is covered with an insulator, or is formed with a natural oxide film, the part 9a for connecting to earth may be formed such that a portion thereof is in contact with the bottom surface of the semiconductor wafer. Since this also allows for removal of charge accumulated on the bottom surface of the semiconductor wafer, the semiconductor wafer can be readily removed from the chucking stage. The grooves are formed only in a fixed direction of the chucking stage because the chuck using static electricity provides a larger effect.

What is claimed is:

1. A sample processing apparatus for removing through light irradiation a charge accumulated on a sample, comprising:

a process chamber for processing a sample by charged particles, said sample having an insulation layer formed on a surface of said sample;

a preparation chamber for preparing said sample to be delivered to said process chamber or extracted from said process chamber;

a chucking stage for electrostatically chucking said sample;

a light source installed in said preparation chamber for irradiating light for exciting electrons in the insulation layer of said sample after said sample is processed in said process chamber by said charged particles and said sample is transferred from said process chamber to said preparation chamber; and earth electrodes for contacting the surface of said sample when said sample is irradiated by the light from said light source in said preparation chamber and the removing of the charge accumulated on the surface of said sample.

2. An apparatus according to claim 1, wherein said process chamber executes processing including at least one of observation, inspection, process and analysis on said sample.

3. An apparatus according to claim 1, wherein said sample comprises an insulator in at least a portion of a top surface and a bottom surface thereof.

4. An apparatus according to claim 1, wherein said light source is installed in said preparation chamber so as to irradiate the top surface of said sample.

5. An apparatus according to claim 1, wherein said light source radiates light at wavelength of 150 nm or less.

6. An apparatus according to claim 1, wherein said light source radiates chopped light once or a plurality of times.

7. An apparatus according to claim 1, wherein said light source includes means for forming light having an elongated cross-section which extends over opposing sides of the surface of said sample and irradiates an area including said earth electrodes, and means for scanning said light from said light forming means across the entire surface of said sample.

8. An apparatus according to claim 1, wherein said light source includes:

means for executing first scanning for scanning light from one of opposing sides of the surface of said sample to the other side at which said earth electrodes are arranged; and means for executing second scanning for scanning in a direction substantially orthogonal to said first scanning for a sufficiently longer period than said first scanning so as to entirely scan across the whole surface of said sample.

9. An apparatus according to claim 1, wherein said light source includes:

means for executing first scanning for repetitively scanning light in reciprocation between opposing sides of the surface of said sample, said opposing sides being formed with earth electrodes; and means for executing second scanning for scanning in a direction substantially orthogonal to said first scanning for a sufficiently longer period than said first scanning so as to entirely scan across the whole surface of said sample.

* * * * *